(12) United States Patent
Takahashi

(10) Patent No.: US 10,246,620 B2
(45) Date of Patent: Apr. 2, 2019

(54) CMP POLISHING AGENT, METHOD FOR MANUFACTURING THEREOF, AND METHOD FOR POLISHING SUBSTRATE

(71) Applicant: SHIN-ETSU CHEMICAL CO., LTD., Tokyo (JP)

(72) Inventor: Mitsuhito Takahashi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 226 days.

(21) Appl. No.: 15/303,564

(22) PCT Filed: Mar. 26, 2015

(86) PCT No.: PCT/JP2015/001729
§ 371 (c)(1),
(2) Date: Oct. 12, 2016

(87) PCT Pub. No.: WO2015/170436
PCT Pub. Date: Nov. 12, 2015

(65) Prior Publication Data
US 2017/0037290 A1    Feb. 9, 2017

(30) Foreign Application Priority Data
May 9, 2014 (JP) .................................. 2014-097625

(51) Int. Cl.
*C09K 3/14* (2006.01)
*B24B 7/22* (2006.01)
(Continued)

(52) U.S. Cl.
CPC ............ *C09K 3/1463* (2013.01); *B24B 7/228* (2013.01); *B24B 37/00* (2013.01); *B24B 37/044* (2013.01);
(Continued)

(58) Field of Classification Search
CPC ......... B24B 7/228; B24B 7/24; B24B 37/042; B24B 37/044; C01F 17/0043; C09G 1/02;
(Continued)

(56) References Cited

U.S. PATENT DOCUMENTS

2001/0034191 A1    10/2001  Nojo et al.
2006/0135045 A1*    6/2006  Bian ..................... C09G 1/02
                                                        451/36
(Continued)

FOREIGN PATENT DOCUMENTS

CN    100587918 C    2/2010
CN    103725256 A    4/2014
(Continued)

OTHER PUBLICATIONS

Aug. 8, 2017 Office Action issued in Japanese Patent Application No. 2014-097625.
(Continued)

*Primary Examiner* — Timothy V Eley
(74) *Attorney, Agent, or Firm* — Oliff PLC

(57) ABSTRACT

The present invention is a CMP polishing agent, including polishing particles, a protective film-forming agent, and water, wherein the protective film-forming agent is a copolymer of styrene and acrylonitrile, and an average molecular weight of the copolymer is 500 or more and 20000 or less. This provides a polishing agent which can polish an insulation film with few polishing scratches and has high polishing selectivity of an insulation film to a polishing stop film in a CMP step, a method for manufacturing the polishing agent, and a method for polishing a substrate by using the polishing agent.

12 Claims, 2 Drawing Sheets

(51) Int. Cl.
| | | |
|---|---|---|
| *C09G 1/04* | (2006.01) | |
| *B24B 37/04* | (2012.01) | |
| *C01F 17/00* | (2006.01) | |
| *C09G 1/02* | (2006.01) | |
| *H01L 21/306* | (2006.01) | |
| *H01L 21/3105* | (2006.01) | |
| *B24B 37/00* | (2012.01) | |
| *B24B 37/20* | (2012.01) | |
| *B24B 37/10* | (2012.01) | |
| *H01L 21/762* | (2006.01) | |

(52) U.S. Cl.
CPC ............ *B24B 37/105* (2013.01); *B24B 37/20* (2013.01); *C01F 17/0043* (2013.01); *C09G 1/02* (2013.01); *C09G 1/04* (2013.01); *H01L 21/30625* (2013.01); *H01L 21/31053* (2013.01); *H01L 21/76224* (2013.01); *C01P 2004/62* (2013.01); *C01P 2004/64* (2013.01)

(58) Field of Classification Search
CPC ... C09G 1/04; C09K 3/1463; H01L 21/30625; H01L 21/31053
See application file for complete search history.

(56) References Cited

U.S. PATENT DOCUMENTS

| | | |
|---|---|---|
| 2007/0175104 A1 | 8/2007 | Nishiyama et al. |
| 2009/0165395 A1 | 7/2009 | Ikeda et al. |
| 2009/0325323 A1 | 12/2009 | Ueno et al. |
| 2011/0124195 A1 | 5/2011 | Park et al. |
| 2012/0129346 A1 | 5/2012 | Ryuzaki et al. |
| 2016/0297998 A1 | 10/2016 | Zhong |
| 2017/0037290 A1* | 2/2017 | Takahashi ............... B24B 37/00 |
| 2017/0278718 A1* | 9/2017 | Takahashi ............... C09G 1/02 |
| 2018/0079930 A1* | 3/2018 | Takahashi ............... B24B 37/00 |

FOREIGN PATENT DOCUMENTS

| | | |
|---|---|---|
| JP | H08-22970 A | 1/1996 |
| JP | H10-106994 A | 4/1998 |
| JP | 2008-098525 A | 4/2008 |
| JP | 2008-147688 A | 6/2008 |
| JP | 2009-070904 A | 4/2009 |
| JP | 2011-529269 A | 12/2011 |
| JP | 4894981 B2 | 3/2012 |
| WO | 2007/069488 A1 | 6/2007 |
| WO | 2008/010499 A1 | 1/2008 |
| WO | 2013/093556 A1 | 6/2013 |
| WO | 2013/093557 A1 | 6/2013 |

OTHER PUBLICATIONS

Nov. 15, 2016 International Preliminary Report on Patentability issued in International Patent Application No. PCT/JP2015/001729.
Oct. 30, 2017 Office Action and Search Report issued in Chinese Patent Application No. 201580024264.3.
Jun. 23, 2015 Search Report issued in International Patent Application No. PCT/JP2015/001729.

\* cited by examiner

CMP POLISHING AGENT, METHOD FOR MANUFACTURING THEREOF, AND METHOD FOR POLISHING SUBSTRATE

TECHNICAL FIELD

The present invention relates to a CMP polishing agent, a method for manufacturing thereof, and a method for polishing a substrate.

BACKGROUND ART

Semiconductor large-scale integrated circuits are required to have a higher density for improving the integration density and achieving high performance. In the wake of miniaturization of wiring patterns, it has been required to reduce the process line width and to shift to multilayer wiring in order to cope with the densification. Such multilayer wiring structures are formed by repeating several deposition and etching of a conductive film and an insulation film, and differences in level on the surface tend to be larger thereby. On the other hand, focal depth of resists used for patterning of wiring tends to be shallow in the wake of miniaturization of wiring patterns. Accordingly, patterning is more largely influenced by the differences in level on the surface, which is regarded as a problem. Therefore, wide-area flattening is required to get rid of the differences in level on the surface in order to perform patterning easily.

As such a wide-area flattening technology, coating technology with a resin such as polyimide, etch back technology on metal and an insulation film, reflow technology on metal and an insulation film, and chemical mechanical polishing (CMP) technology are known.

The chemical mechanical polishing (CMP) step is performed by supplying slurry which contains polishing particles onto a substrate and by using a polishing pad attached to a polishing apparatus. In this case, the polishing particles polish the surface mechanically under pressure from the polishing apparatus, and chemical ingredients contained in the slurry chemically react to the surface of the substrate to remove the surface part of the substrate chemically.

As a rule, various kinds of slurry are used for chemical mechanical polishing (CMP) depending on the type of a film to be removed and a property thereof. The polishing particles to be used include silica ($SiO_2$), ceria ($CeO_2$), alumina ($Al_2O_3$), titania ($TiO_2$), zirconia ($ZrO_2$), etc., and can be used selectively depending on a film to be polished.

Previously, it has been generally investigated the use of silica-based slurry as a slurry for chemical mechanical polishing (CMP) to flatten an insulation film such as a silicon oxide film. The silica-based slurry is produced by grain growth of silica particles through thermal decomposition of silicon tetrachloride, and by pH adjustment with the use of an alkaline metal-free alkaline solution such as ammonia.

As a slurry for chemical mechanical polishing (CMP) of an inorganic insulation film such as a silicon oxide film, ceria slurry which contains ceria particles as polishing particles have been used. Ceria particles have lower hardness compared to silica particles or alumina particles, and are hard to generate defects such as scratches on the surface of a polished film, thereby being considered to be useful. Ceria particle are known as a strong oxidizing agent and have a chemically active property. Accordingly, ceria slurry is considered to be useful for application to chemical mechanical polishing (CMP) of an inorganic insulation film such as a silicon oxide film (e.g., see Patent Document 1, Patent Document 2).

In a conventional step for forming STI (Shallow Trench Isolation), a polishing step is performed with the use of a silicon nitride film as a hard mask. The silicon nitride film is formed on a substrate, and then a trench is formed on a prescribed area of the silicon nitride film and the substrate. A silicon oxide film is formed so as to fill the trench, and then the silicon oxide film is polished to form a device isolation film on the trench part. In this case, the silicon oxide film is polished until the silicon nitride film is exposed by using dry ceria slurry, etc., which can secure high polishing selectivity between a silicon oxide film and a silicon nitride film.

On the other hand, a polysilicon film is used as a polishing stop film in some cases instead of using a silicon nitride film as a hard mask. In this case, since polysilicon films have lower hardness compared to silicon nitride films, there arises a problem that defects such as scratches are tend to generate on the surface of the polysilicon film after CMP polishing. When the surface after CMP polishing has a defect such as a scratch, snapping failure and short circuit failure can be occurred in minute transistors and wiring.

In order to suppress defects such as scratches, it is possible to apply wet ceria, for example, to the CMP step as abrasive grains. This is because wet ceria has a polyhedron structure, and can largely improve scratch defects thereby.

Although defects such as scratches can be remedied by the use of wet ceria, polishing selectivity between a silicon oxide film and a polysilicon film is not sufficient. Then, chemical mechanical polishing (CMP) involves a problem that a polysilicon film of a polishing stop film is polished excessively. Accordingly, it has been required to improve the CMP polishing agent.

For example, Patent Document 3 discloses a polishing agent which contains polyoxyethylene amine ether as a polish finisher for polishing a polysilicon film. Patent Document 4 discloses a polishing agent which contains a cationized polyvinyl alcohol, and at least one type of saccharide selected from the group consisting of an amino sugar, a derivative thereof, a polysaccharide containing an amino sugar, and a derivative thereof. These polishing agents, however, do not have a sufficient protective function for a polysilicon film, and have a problem of cleaning property after CMP polishing. Accordingly, it has been required for improving a CMP polishing agent.

CITATION LIST

Patent Literature

Patent Document 1: Japanese Unexamined Patent publication (Kokai) No. H08-022970
Patent Document 2: Japanese Unexamined Patent publication (Kokai) No. H10-106994
Patent Document 3: Japanese Unexamined Patent publication (Translation of PCT Application) No. 2011-529269
Patent Document 4: Japanese Patent No. 4894981

SUMMARY OF INVENTION

Technical Problem

The present invention was accomplished in view of the above-described problems. It is an object of the present invention to provide a polishing agent which can polish a substrate with few polishing scratches and has high polishing selectivity in a CMP step, a method for manufacturing the polishing agent, and a method for polishing a substrate by using the polishing agent.

Solution to Problem

To solve the problems described above, the present invention provides a CMP polishing agent, comprising polishing particles, a protective film-forming agent, and water, wherein the protective film-forming agent is a copolymer of styrene and acrylonitrile, and an average molecular weight of the copolymer is 500 or more and 20000 or less.

This can achieve high polishing selectivity of a film to be polished to a film not to be polished, and can perform high-accuracy polishing without polishing a substrate excessively. Furthermore, it is possible to reduce scratches on the polished surface of a substrate after being polished. In polishing an insulation film of a substrate having a silicon oxide film as an insulation film and a polysilicon film as a polishing stop film, for example, the polishing selectivity, which is a ratio of polishing rates between an insulation film and a polishing stop film, becomes particularly large. This makes it easy to stop polishing when a polishing stop film is exposed, and accordingly, polishing stop property can be enhanced. It also makes the ability to reduce defects such as scratches particularly favorable, thereby being preferable to polish the foregoing substrate.

In this case, the polishing particles are preferably wet ceria particles.

When the polishing particles are wet ceria particles, generation of defects such as scratches can be suppressed more securely.

It is also possible to contain the copolymer of styrene and acrylonitrile in an amount of 0.1 part by mass or more and 5 parts by mass or less on the basis of 100 parts by mass of the polishing particles.

This allows the polishing agent to have higher polishing selectivity, and to further suppress generation of defects such as scratches.

In this case, the CMP polishing agent preferably has pH of 3 or more and 7 or less.

This makes the polishing agent be a polishing agent which has higher polishing selectivity and can further suppress generation of defects such as scratches.

The CMP polishing agent is preferably a CMP polishing agent for polishing an insulation film.

The inventive polishing agent has higher polishing selectivity, and can polish an insulation film highly accurately thereby. Accordingly, the inventive polishing agent is particularly preferable to be used for polishing an insulation film.

The present invention further provides a method for polishing a substrate, comprising:

moving the substrate and a turn table relatively to polish an insulation film on a polishing stop film formed on the substrate, with the insulation film being pressed against a polishing pad stuck on the turn table for polishing the substrate, while supplying the foregoing CMP polishing agent onto the polishing pad.

The method for polishing a substrate by using the inventive CMP polishing agent can achieve high polishing selectivity of an insulation film to a polishing stop film, and can achieve highly accurate polishing without polishing a polishing stop film excessively. It hardly generate defects such as scratches on the polished surface of a substrate.

In this case, the polishing stop film can be a polysilicon film, and the insulation film can be a silicon oxide film.

The inventive polishing method is particularly preferable for polishing an insulation film of a substrate which has a silicon oxide film as the insulation film and polysilicon film as a polishing stop film. By the inventive polishing method, it is possible to obtain high polishing selectivity of a silicon oxide film to a polysilicon film, and to further reduce generation of defects such as scratches on a polished surface.

In order to achieve the foregoing objects, the present invention further provides a method for manufacturing the foregoing CMP polishing agent, comprising a step of:

adding a copolymer of styrene and acrylonitrile having an average molecular weight of 500 or more and 20000 or less as the protective film-forming agent.

This can ensure to obtain a CMP polishing agent which has high selectivity and can suppress generation of defects such as scratches due to polishing.

Advantageous Effects of Invention

The inventive CMP polishing agent can achieve high polishing selectivity, and can perform highly accurate polishing in a CMP step. Furthermore, it is possible to suppress generation of scratches on the polished surface of a substrate.

DESCRIPTION OF EMBODIMENTS

Hereinafter, the present invention will be described with reference to embodiments, but the present invention is not limited thereto.

The inventive CMP polishing agent is characterized by comprising a copolymer of styrene and acrylonitrile having a weight-average molecular weight of 500 or more and 20000 or less.

Hereinafter, the mechanism to achieve high ratio of polishing rates (polishing selectivity), which is one of the effect of the present invention, will be described with exemplifying a case of polishing a substrate in which the insulation film is a silicon oxide film and the polishing stop film is a polysilicon film.

On the basis of an inventors' knowledge, the foregoing effect differs in its degree from the interaction between the copolymer of styrene-acrylonitrile and a silicon oxide film to the interaction between the copolymer of styrene-acrylonitrile and a polysilicon film. It is assumed that this is a reason for obtaining high polishing selectivity of a silicon oxide film to a polysilicon film.

Figure 1:
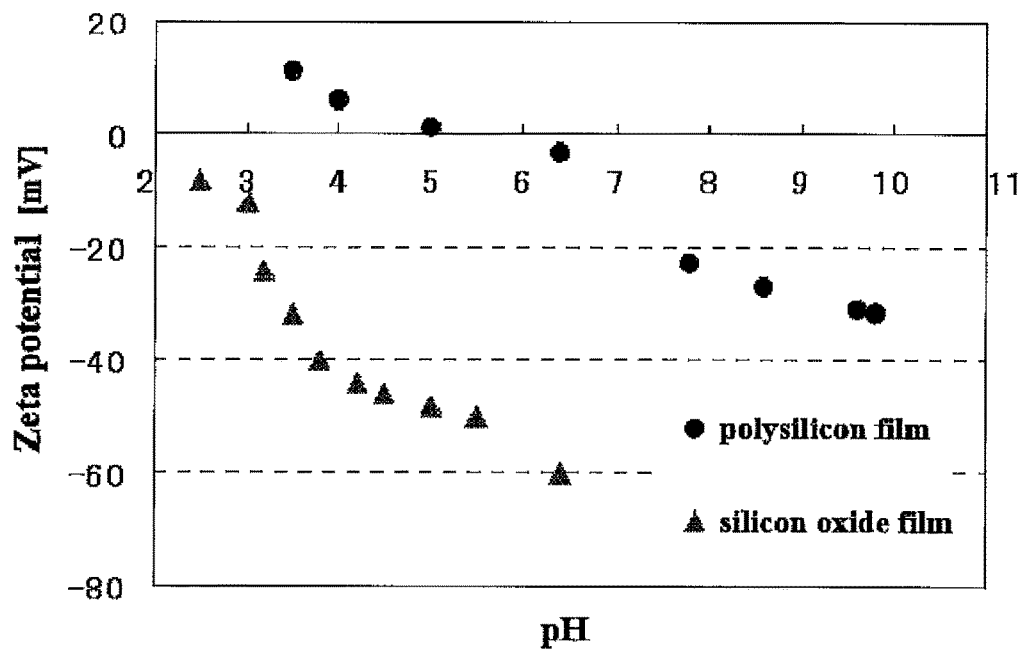
FIG. 1 is a graph to show Zeta potential of a polysilicon film and a silicon oxide film according to pH.

The relations of Zeta potential of a polysilicon film and a silicon oxide film according to pH are shown in FIG. 1. With referring FIG. 1, it can be seen that a polysilicon film has more positive potential compared to a silicon oxide film in a range where the pH is from 3 to 7. Accordingly, the nitrile group, which is negatively polarized, in a copolymer of styrene and acrylonitrile efficiently interacts with a polysilicon film, which has more positive potential, and the copolymer of styrene and acrylonitrile comes to be a protective film for the polysilicon film thereby. Furthermore, it is assumed that the styrene chain, which is a hydrophobic part, efficiently interacts with the hydrophobic polysilicon film to form the protective film for the polysilicon film, which inhibits polishing of the polysilicon film, and differs in the polishing rate from a silicon oxide film.

Accordingly, the pH of the CMP polishing agent is preferably 3 or more and 7 or less in the present invention.

Hereinafter, the inventive polishing agent, the method for manufacturing thereof, and the method for polishing a substrate with the inventive polishing agent will be described in more detail.

As described above, the inventive CMP polishing agent contains polishing particles, a protective film-forming agent, and water. As the protective film-forming agent, a copolymer of styrene and acrylonitrile is contained, and an average molecular weight of the copolymer is 500 or more and 20000 or less.

It is preferable for the polishing particles contained in the inventive polishing agent to be wet ceria particles.

Wet ceria particles are preferable in that they can remedy polishing scratches such as micro scratches since they have a polyhedron structure and do not form a particle with a large secondary particle diameter.

In the present invention, the average particle size of the wet ceria particles is preferably in a range of 5 nm to 200 nm. The average particle size of the wet ceria particles to be used is more preferably in a range of 20 nm to 100 nm, further preferably in a range of 40 nm to 70 nm.

In such a range, the average particle size of the wet ceria particles is not too small, and the polishing rate for a film to be polished is not too low. The average particle size of the wet ceria particles is not too large either, and can suppress generation of polishing scratches such as micro scratches thereby.

The concentration of the polishing particle in the polishing agent is not particularly limited. It is, however, preferably 0.1 part by mass or more, more preferably 0.5 part by mass or more, and further preferably 1 part by mass or more on the basis of 100 parts by mass of the polishing agent in view of obtaining a favorable polishing rate for an insulation film. The upper limit of the concentration of the polishing particle is preferably 20 parts by mass or less, more preferably 10 parts by mass or less, further preferably 5 parts by mass or less in view of improving the storage stability of the polishing agent.

As a method for producing the wet ceria particles, it is preferable that the wet ceria particles are produced by a method in which a cerium salt as a precursor is mixed with a basic solution and the mixture is subjected to heat treatment to produce wet ceria particles. Hereinafter, this producing method is specifically described.

First, a cerium salt, which is a precursor of wet ceria particles, is mixed with ultrapure water to produce an aqueous cerium solution. The cerium salt and ultrapure water can be mixed in a ratio of 2:1 to 4:1, for example. Herein, as the cerium salt, it is possible to use at least one of Ce(III) salts and Ce(IV) salts. That is, it is possible to mix at least one Ce(III) salt with ultrapure water, to mix at least one Ce(IV) salt with ultrapure water, or to mix at least one Ce(III) salt and at least one Ce(IV) salt with ultrapure water.

As the Ce(III) salt, it is possible to mix cerium(III) chloride, cerium(III) fluoride, cerium(III) sulfate, cerium (III) nitrate, cerium(III) carbonate, cerium(III) perchlorate, cerium(III) bromide, cerium(III) sulfide, cerium(III) iodide, cerium(III) oxalate, cerium(III) acetate, etc.

As the Ce(IV) salt, it is possible to mix cerium(IV) sulfate, cerium(IV) ammonium nitrate, cerium(IV) hydroxide, etc. Among them, cerium(III) nitrate and cerium(IV) ammonium nitrate are preferably used as a Ce(III) salt and a Ce(IV) salt respectively for ease of use.

It is also possible to mix an acidic solution in order to stabilize the aqueous cerium solution produced by mixing with ultrapure water. Herein, the acidic solution and the cerium solution can be mixed in a ratio of 1:1 to 1:100. Illustrative examples of the acid solution usable for this procedure include hydrogen peroxide, nitric acid, acetic acid, hydrochloric acid, sulfuric acid, etc. The cerium solution mixed with the acid solution can be adjusted to have pH of 0.01, for example.

In addition to the cerium solution, a basic solution is produced. As the basic solution, it is possible to use ammonia, sodium hydroxide, potassium hydroxide, etc., each of which is used by being mixed with ultrapure water and diluted to appropriate concentration. As the dilution rate, it is possible to dilute the basic material with ultrapure water in a ratio of 1:1 to 1:100. The diluted basic solution can be adjusted to have pH of 11 to 13, for example.

Then, the diluted basic solution is transferred to a reaction vessel, and subsequently stirred for 5 hours or less, for example, under an atmosphere of inert gas such as nitrogen, argon, and helium. To the diluted basic solution, the cerium solution is mixed in a rate of 0.1 litter per second or more, for example. Subsequently, heat treatment is performed at a prescribed temperature. This heat treatment can be performed at a heat treatment temperature of 100° C. or less, e.g. 60° C. or more and 100° C. or less; and can be performed for a heat treatment time of 2 hours or more, e.g. 2 hours to 10 hours. As the temperature-increasing rate, it is possible to increase the temperature from room temperature to the temperature of heat treatment at a rate of 0.2° C. to 1° C. per minute, preferably 0.5° C. per minute.

Last of all, the mixed solution subjected to heat treatment is cooled to room temperature. These processes allow to produce a mixed liquid in which wet ceria particles are formed having a primary particle diameter of 100 nm or less, for example.

As described above, by increasing the temperature of mixed solution of an aqueous precursor solution of a cerium salt and a diluted basic solution at an appropriate temperature-increasing rate and heating at a heat treatment temperature in an appropriate range, the cerium salts in the mixed solution are reacted in temperature-increase process to form fine nuclei of ceria ($CeO_2$); around these fine nuclei, crystals are allowed to grow to produce wet ceria particles of crystal particles having 5 to 100 nm, for example.

The inventive CMP polishing agent is characterized by comprising a copolymer of styrene and acrylonitrile as a protective film-forming agent. Herein, the protective film-forming agent means material which forms a protective film by being adsorbed mainly onto the part of the surface other than the film to be polished in polishing of a substrate, and plays a rule to suppress excess polishing of the part other than the film to be polished.

The copolymer of styrene and acrylonitrile contained in the present invention as a protective film-forming agent has an effect to enhance polishing selectivity of a film to be polished to a film not to be polished, further suppressing generation of polishing scratches on a polysilicon film when the polysilicon film is used as a polishing stop film. It is considered that a styrene chain and a nitrile group, which are hydrophobic parts of the copolymer of styrene and acrylonitrile, interact with a film not to be polished such as a polysilicon film to form a protective film on the surface of the film not to be polished, and polishing scratches can be suppressed thereby.

The average molecular weight of the copolymer of styrene and acrylonitrile to be used is 500 to 20000, since the dispersibility into a polishing agent gets worse, and the stability of the polishing agent tends to lower thereby when the average molecular weight is more than 20000, and the formation of a protective film gets insufficient when the average molecular weight is less than 500.

As a molar ratio of styrene and acrylonitrile in the copolymer, it is preferred that styrene/acrylonitrile be from 10/90 to 90/10.

The concentration in the polishing agent is preferably in a range of 0.01 part by mass to 1 part by mass on the basis of 100 parts by mass of the polishing agent.

When the copolymer of styrene and acrylonitrile is contained in a range of 0.01 part by mass to 1 part by mass on the basis of 100 parts by mass of the polishing agent, a protective film can be formed sufficiently, and high protection effect can be obtained thereby.

In the present invention, the copolymer of styrene and acrylonitrile is preferably blended in an amount of 0.1 part by mass or more and 5 parts by mass or less on the basis of 100 parts by mass of the polishing particles.

Such a blend ratio makes the polishing agent be a polishing agent which has higher polishing selectivity and can further suppress generation of defects such as scratches.

Other than the copolymer of styrene and acrylonitrile, the inventive polishing agent can contain other additives in order to adjust the polishing property.

Such additives include an anionic surfactant and amino acid, which can convert the surface potential of polishing particles to negative.

Illustrative examples of the anionic surfactant include a salt of monoalkylsulfuric acid, a salt of monoalkylpolyoxyethylene sulfuric acid, a salt of alkylbenzen sulfonic acid, a salt of monoallylphosphoric acid, a salt of laurylsulfuric acid, polycarboxylic acid, a salt of polyacrylic acid, and a salt of polymethacrylic acid.

Illustrative examples of the amino acid include arginine, lysine, aspartic acid, glutamic acid, asparagine, glutamine, histidine, proline, tyrosine, serine, tryptophan, threonine, glycine, alanine, methionine, cysteine, phenylalanine, leucine, valine, and isoleucine.

When these additives are used, the concentration of the additive in the polishing agent is preferably in a range of 0.01 part by mass to 0.1 part by mass on the basis of 1 part by mass of the polishing particles. More preferably, it is contained in a range of 0.02 part by mass to 0.06 part by mass.

When the amount is 0.01 part by mass or more on the basis of 1 part by mass of the polishing particles, it is possible to suppress lowering of the dispersion stability of a polishing agent. The content of 0.1 part by mass or less does not cause to inhibit polishing of a film to be polished, nor to generate a problem to lower the polishing rate. Accordingly, in such a content, it is possible to adjust the contents of an additive so as to improve the dispersion stability of the polishing agent and so as not to inhibit polishing.

The pH of the inventive polishing agent is preferably in a range of 3.0 or more and 7.0 or less in view of the excellent storage stability of the polishing agent and the polishing rate. The lower limit of the pH influences to the dispersion stability of the polishing agent, and is preferably 4.0 or more, more preferably 6.0 or more. The upper limit influences to polishing rate, and is preferably 7.0 or less. The pH of 7.0 or less does not cause sudden increase of a polishing rate of a polysilicon film due to basicity, nor lowering of the polishing selectivity of a silicon oxide film to a polysilicon film.

The pH of the polishing agent can be adjusted by an addition of inorganic acid such as hydrochloric acid, nitric acid, sulfuric acid, and phosphoric acid; organic acid such as formic acid, acetic acid, citric acid, and oxalic acid; base such as ammonia, sodium hydroxide, potassium hydroxide, and tetramethylammonium hydroxide (TMAH).

Then, the method for polishing a substrate by using the inventive polishing agent will be described. Hereinafter, it will be described with exemplifying a case in which one side of a semiconductor substrate is subjected to CMP polishing.

Figure 2:
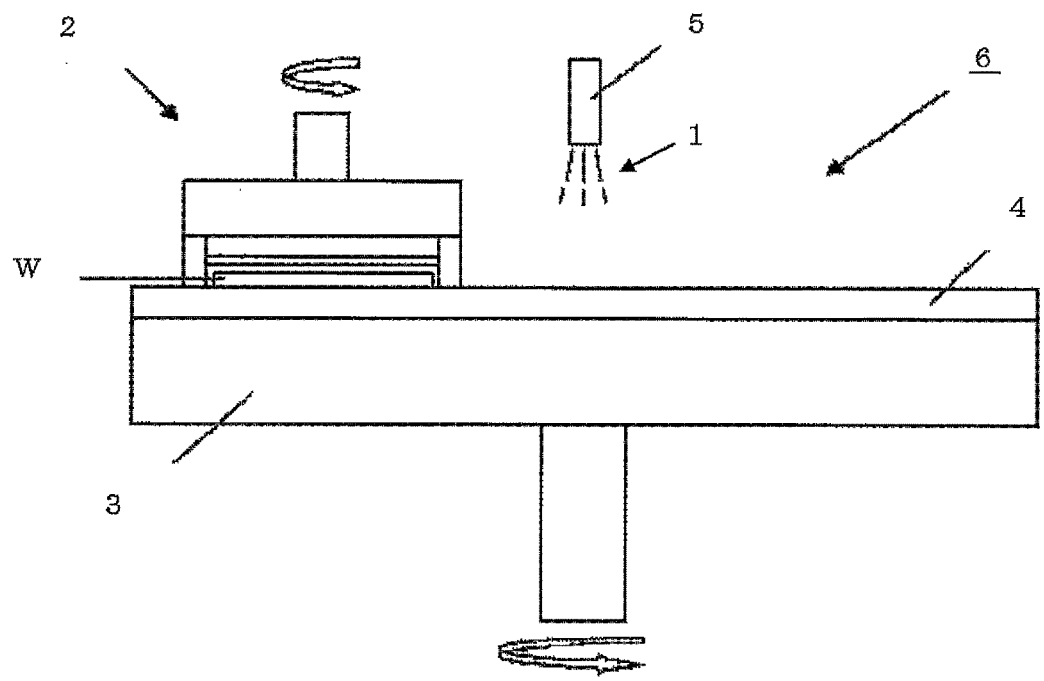
FIG. 2 is a schematic diagram to show an example of a single-side polishing apparatus which can be used in the inventive polishing method.

A single-side polishing apparatus can be a single-side polishing apparatus 6 composed of a turn table 3 on which a polishing pad 4 is stuck, a polishing-agent-supply mechanism 5, and a polishing head 2, for example, as shown in FIG. 2.

In such a single-side polishing apparatus 6, polishing is performed by holding a semiconductor substrate W by the polishing head 2, while supplying the inventive CMP polishing agent 1 onto the polishing pad 4 from the polishing-agent-supply mechanism 5, and rotating each of the turn table 3 and the polishing head 2 with the surface of the substrate W being brought into sliding contact with the polishing pad 4.

As the polishing pad, it is possible to use nonwoven fabric, polyurethane foam, porous resin, etc. It is preferable to supply the CMP polishing agent 1 continuously by the polishing-agent-supply mechanism 5 equipped with a pump, etc. so as to coat the surface of the pad with the polishing agent continually during performance of polishing.

The inventive polishing method polishes an insulation film on a polishing stop film formed on the substrate W by moving the substrate W and the turn table 3 relatively, with the insulation film being pressed against a polishing pad stuck on the turn table, while supplying the inventive CMP polishing agent 1 onto the polishing pad 4.

The substrate W to be polished can be a substrate relates to production of semiconductor devices, and illustrative examples thereof include a substrate in which an insulation film and a polishing stop film are formed on a semiconductor substrate with an STI pattern or a wiring pattern being formed thereon. The film to be polished is the insulation film formed on these patterns, and illustrative examples thereof include a silicon oxide film. Illustrative examples of a polishing stop film include polysilicon film. The insulation film formed on such a semiconductor substrate is polished with the inventive polishing agent, and the surface of the semiconductor substrate can be a flat surface thereby.

The polishing method by use of the inventive polishing agent is particularly applicable to polish a substrate in which the polishing stop film under a film to be polished (on a base substrate side) is a polysilicon film, and the film to be polished can be an insulation film composed of silicon oxide, etc. Illustrative examples of such a substrate include an NAND flash memory device substrate. The following will describe a case in which the inventive polishing agent is applied to a CMP step of this NAND flash memory device substrate.

Figure 3:
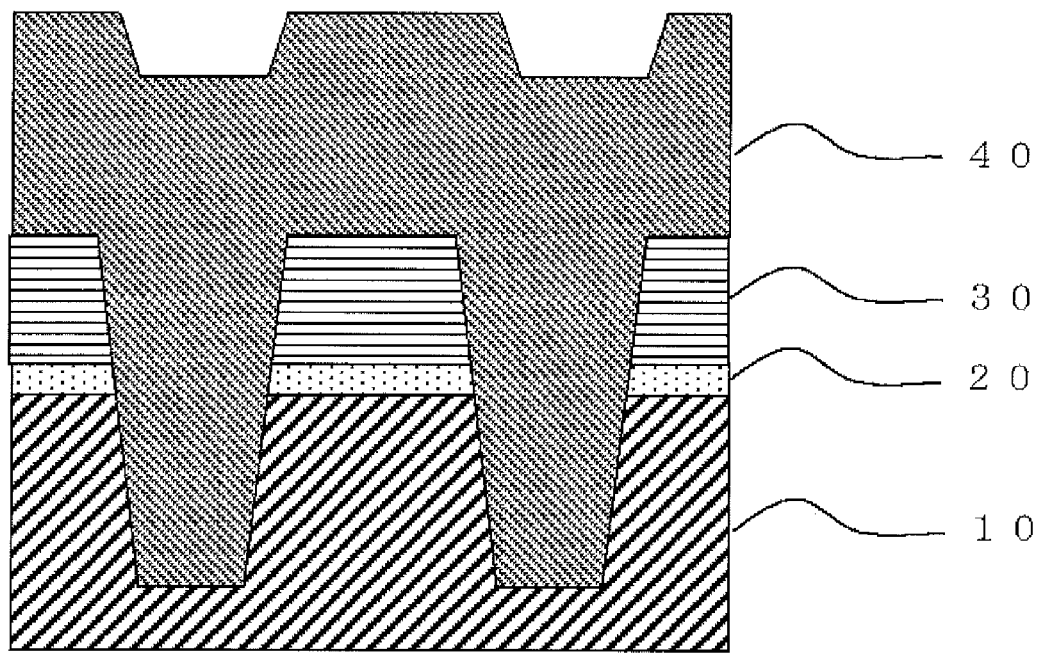
FIG. 3 is a sectional view of a semiconductor device having a conductive film as a polishing stop film.

The NAND flash memory device substrate can be a one, for example, in which plural of trenches are formed by etching a prescribed area through a conductive film 30 and a tunnel oxide film 20 to a base substrate 10 in a prescribed depth, and an insulation film 40 is formed so as to fill in the trenches as shown in FIG. 3. Herein, the conductive film 30 can be formed of a polysilicon film, etc. which can be a floating gate, and plays a part as a polishing stop film in this case.

The insulation film 40 is formed of oxide film type material such as a BPSG film, a PSG film, a HDP film, a TEOS film, a USG film, a PETEOS film, and a HARP film. Illustrative examples of a method for forming the insulation film 40 include a PVD method, a CVD method, a MOCVD method, and an ALD method.

Illustrative examples of the base substrate 10 include a silicon substrate.

Figure 4:
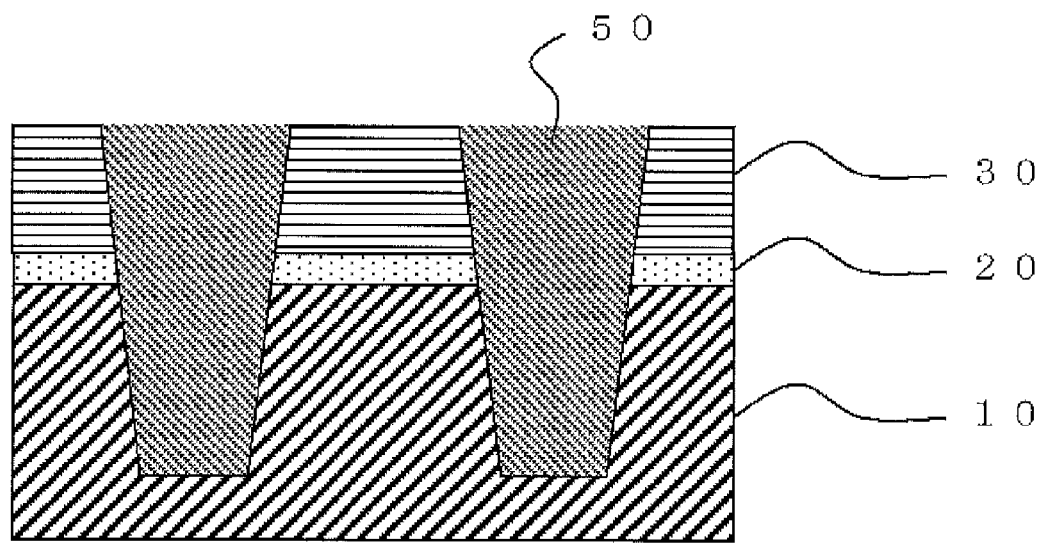
FIG. 4 is a sectional view of a semiconductor device after CMP polishing of the insulation film by using the inventive polishing agent.

An STI isolation film 50 with the insulation film 40 being removed by polishing as shown in FIG. 4 can be formed by setting the NAND flash memory device substrate having the base substrate 10 in which the insulation film 40 is filled in the trenches as shown in FIG. 3 to a polishing apparatus as shown in FIG. 2, and then polishing the insulation film 40 with using the inventive polishing agent until the conductive film 30 is exposed. In this case, it is preferred that the polishing selectivity of the insulation film 40 to the conductive film 30 be 10 or more. When the polishing selectivity is less than 10, the difference between the polishing rates of the insulation film 40 and the conductive film 30 becomes smaller, and it becomes difficult to detect a prescribed point to stop polishing. Accordingly, the insulation film 40 and the conductive film 30 can be excessively polished, and generation of defects is increased thereby. When the polishing selectivity is 10 or more, it comes easy to detect the point to stop polishing, which is more favorable for forming the STI isolation film. In the present invention, this polishing selectivity of the isolation film to the conductive film can be 30 or more.

As described above, by applying a polishing agent comprising a copolymer of styrene and acrylonitrile with the average molecular weight of 500 to 20000 to a CMP polishing of the insulation film 40 in case of applying the conductive film 30 as a polishing stop film, it is possible to obtain high polishing selectivity of the insulation film 40 to the conductive film 30. Accordingly, when the present invention is applied to an STI formation, for example, it comes to be possible to form an STI film having few defects such as scratches.

As described above, the present invention can achieve high polishing selectivity, and can perform highly accurate polishing in a CMP step. Furthermore, it is possible to suppress generation of scratches on the polished surface of a substrate.

EXAMPLE

Hereinafter, the present invention will be described in more detail with reference to Examples and Comparative Examples, but the present invention is not limited thereto.
(Synthesis of Wet Ceria)

To a solution of 1000 g of cerium nitrate hexahydrate ($Ce(NO_3)_3 \cdot 6H_2O$) dissolved in 250 g of pure water, 100 g of nitric acid was mixed to obtain a cerium(III) solution. Then, 1 g of diammonium cerium nitrate (($NH_4)_2Ce(NO_3)_3$) was dissolved in 500 g of pure water to obtain a cerium(IV) solution. Subsequently, the cerium(III) solution and the cerium(IV) solution were mixed to obtain a mixed cerium solution.

Next, 4000 g of pure water was added dropwise to a reaction vessel under nitrogen atmosphere, and then 1000 g of aqueous ammonia was added dropwise to the reaction vessel and stirred to obtain a basic solution.

Subsequently, the mixed cerium solution was added dropwise to the reaction vessel and mixed with the basic solution with stirring, and then heated to 80° C. under nitrogen atmosphere. Heat treatment was performed for 8 hours to obtain a mixed solution containing ceria particles.

After cooling the mixed solution containing ceria particles to room temperature, nitric acid was added dropwise to the mixed solution to adjust the mixed solution to be acidic with the pH of 4 or less, and the reaction was terminated thereby. After precipitating ceria particles in the mixed liquid, several times of washing with pure water and centrifugation were repeated to wash, and ceria particles were obtained in the end.
(Preparation of CMP Polishing Agent)

The ceria particles synthesized by the foregoing method, a copolymer of styrene and acrylonitrile, and pure water were mixed, and subjected to ultrasonic dispersing for 60 minutes with stirring. The obtained slurry was filtered through a 0.5 micron filter, and then diluted with pure water to obtain a CMP polishing agent.
(Polishing of Substrate)

To a polishing head of a single-side polishing apparatus shown in FIG. 2, a silicon substrate on which a silicon oxide film had been formed by a plasma CVD method was set with the surface of the silicon oxide film downward. Then, polishing was performed for 60 seconds with rotating each of the turn table and the polishing head at a rate of 70 rpm by using a polishing pad (IC1000/Suba IV CMP pad: Dow chemical) under a polishing load of 6 psi (pound per square inch) while supplying the CMP polishing agent prepared above at 100 ml per minute. After the polishing was finished, the substrate was removed from the polishing head, washed with pure water, subjected to ultrasonic cleaning, and then dried at 80° C. by using a drying oven. Then, the polishing rate was calculated by measuring the change of the film thickness before and after the polishing with a spectroscopic ellipsometer. Similarly, a silicon substrate in which a polysilicon film had been formed by a low-pressure CVD method was polished in the same conditions, and the change of the film thickness before and after the polishing was measured to calculate the polishing rate. The number of polishing scratches generated on the surface of the polished polysilicon film was determined under a scanning electron microscope.

Example 1

A CMP polishing agent with the ceria particle concentration of 1 part by mass containing 0.03 part by mass of a copolymer of styrene and acrylonitrile was prepared as follows: 500 g of the wet ceria particles synthesized above, 15 g of a copolymer of styrene and acrylonitrile having an average molecular weight of 600, and 5000 g of pure water were mixed; subjected to ultrasonic dispersing for 60 minutes with stirring; then, filtered through a 0.5 micron filter; and diluted with pure water.

The pH of the obtained CMP polishing agent was 6.3. The distribution of particle diameters was measured with an ultrasonic attenuation particle size distribution analyzer (Zeta-APS: manufactured by Matec). As the result, the average particle size was 0.10 micrometer.

Example 2

A CMP polishing agent was prepared in the same manner as in Example 1, except for adding a copolymer of styrene and acrylonitrile having an average molecular weight of 8000.

The pH of the obtained CMP polishing agent was 6.5. The distribution of particle diameters was measured with an ultrasonic attenuation particle size distribution analyzer (Zeta-APS: manufactured by Matec). As the result, the average particle size was 0.11 micrometer.

Example 3

A CMP polishing agent was prepared in the same manner as in Example 1, except for adding a copolymer of styrene and acrylonitrile having an average molecular weight of 16000.

The pH of the obtained CMP polishing agent was 6.5. The distribution of particle diameters was measured with an ultrasonic attenuation particle size distribution analyzer (Zeta-APS: manufactured by Matec). As the result, the average particle size was 0.10 micrometer.

Example 4

A CMP polishing agent was prepared in the same manner as in Example 1, except for adding a copolymer of styrene and acrylonitrile having an average molecular weight of 20000.

The pH of the obtained CMP polishing agent was 6.5. The distribution of particle diameters was measured with an ultrasonic attenuation particle size distribution analyzer (Zeta-APS: manufactured by Matec). As the result, the average particle size was 0.10 micrometer.

Example 5

A CMP polishing agent was prepared in the same manner as in Example 1, except for adding a copolymer of styrene and acrylonitrile having an average molecular weight of 500.

The pH of the obtained CMP polishing agent was 6.5. The distribution of particle diameters was measured with an ultrasonic attenuation particle size distribution analyzer (Zeta-APS: manufactured by Matec). As the result, the average particle size was 0.10 micrometer.

Comparative Example 1

A CMP polishing agent was prepared in the same manner as in Example 1, except for adding a copolymer of styrene and acrylonitrile having an average molecular weight of 300.

The pH of the obtained CMP polishing agent was 6.4. The distribution of particle diameters was measured with an ultrasonic attenuation particle size distribution analyzer (Zeta-APS: manufactured by Matec). As the result, the average particle size was 0.11 micrometer.

Comparative Example 2

A CMP polishing agent was prepared in the same manner as in Example 1, except for adding a copolymer of styrene and acrylonitrile having an average molecular weight of 25000.

The pH of the obtained CMP polishing agent was 6.4. The distribution of particle diameters was measured with an ultrasonic attenuation particle size distribution analyzer (Zeta-APS: manufactured by Matec). As the result, the average particle size was 0.11 micrometer.

Comparative Example 3

A CMP polishing agent was prepared in the same manner as in Example 1, except that a copolymer of styrene and acrylonitrile was not added.

The pH of the obtained CMP polishing agent was 6.5. The distribution of particle diameters was measured with an ultrasonic attenuation particle size distribution analyzer (Zeta-APS: manufactured by Matec). As the result, the average particle size was 0.13 micrometer.

Comparative Example 4

A CMP polishing agent was prepared in the same manner as in Example 1, except that an ammonium salt of polyacrylic acid having an average molecular weight of 10000 was added instead of a copolymer of styrene and acrylonitrile.

The pH of the obtained CMP polishing agent was 6.1. The distribution of particle diameters was measured with an ultrasonic attenuation particle size distribution analyzer (Zeta-APS: manufactured by Matec). As the result, the average particle size was 0.10 micrometer.

By using each of the CMP polishing agent prepared in Examples and Comparative Examples, CMP polishing was performed for 60 seconds under the foregoing polishing conditions on the foregoing substrate set to a polishing apparatus. The change of the film thickness before and after the polishing was measured to calculate each polishing rate of the silicon oxide film and the polysilicon film. The results are shown in Table 1. It is to be noted that each number in the Table is an average value of 5 pieces of substrate which was subjected to CMP polishing in each of Examples and Comparative Examples.

Table 1 shows a summary of results of Examples and Comparative Examples.

TABLE 1

| | Protective film-forming agent type & average molecular weight | | Polishing rate | | | Polishing |
|---|---|---|---|---|---|---|
| | Type | Average molecular weight | Silicon oxide film (Å/min) | Polysilicon film (Å/min) | Polishing selectivity | scratches (number) |
| Example 1 | Copolymer of styrene-acrylonitrile | 600 | 1500 | 20 | 75.0 | 1 |
| Example 2 | Copolymer of styrene-acrylonitrile | 8000 | 1400 | 15 | 93.3 | 0 |
| Example 3 | Copolymer of styrene-acrylonitrile | 16000 | 1500 | 18 | 83.3 | 0 |

TABLE 1-continued

|  | Protective film-forming agent type & average molecular weight | | Polishing rate | | | Polishing scratches (number) |
|---|---|---|---|---|---|---|
|  | Type | Average molecular weight | Silicon oxide film (Å/min) | Polysilicon film (Å/min) | Polishing selectivity |  |
| Example 4 | Copolymer of styrene-acrylonitrile | 20000 | 1500 | 16 | 93.7 | 0 |
| Example 5 | Copolymer of styrene-acrylonitrile | 500 | 1500 | 21 | 71.4 | 2 |
| Comparative Example 1 | Copolymer of styrene-acrylonitrile | 300 | 1400 | 110 | 12.7 | 5 |
| Comparative Example 2 | Copolymer of styrene-acrylonitrile | 25000 | 1200 | 60 | 20.0 | 6 |
| Comparative Example 3 | — | — | 1900 | 600 | 3.2 | 16 |
| Comparative Example 4 | Ammonium salt of polyacrylic acid | 10000 | 1300 | 60 | 21.7 | 8 |

As shown in the results of Example 1 to Example 5 listed in Table 1, polishing by using the inventive CMP polishing agent could suppress generation of scratches on the film surface due to polishing, and could obtain very high polishing selectivity as the polishing selectivity of an insulation film (a silicon oxide film) to a polishing stop film (a polysilicon film) was 30 or more.

On the other hand, in the CMP polishing of Comparative Example 1, since the average molecular weight of the copolymer of styrene and acrylonitrile was as small as less than 500, the formation of a protective film on a polysilicon film was insufficient. As a result, the polishing selectivity of a silicon oxide film to a polysilicon film was low. The number of generated polishing scratches was increased twice or more compared to Example 1 to Example 5.

In the CMP polishing of Comparative Example 2, since the average molecular weight of the copolymer of styrene and acrylonitrile was more than 20000, the dispersibility to a polishing agent was worse. As a result, the interaction with a polysilicon film lowered, and the polishing selectivity to a polysilicon film and the number of generated polishing scratches were inferior to Examples.

On the other hand, the CMP polishing agent of Comparative Example 3, in which a protective film-forming agent was not added, resulted in small selectivity and generation of many polishing scratches.

Furthermore, the CMP polishing agent of Comparative Example 4, in which an ammonium salt of polyacrylic acid was used instead of a copolymer of styrene and acrylonitrile as a protective film-forming agent, showed markedly inferior effects compared to the polishing agents of Examples, although it revealed slight effects of improving the polishing selectivity to a polysilicon film and lowering of polishing scratches.

As described above, by the use of the inventive CMP polishing agent to perform CMP polishing using a polysilicon film as a polishing stop film, high polishing selectivity to the polysilicon film can be obtained and polishing can be performed with few generation of polishing scratches.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A CMP polishing agent, comprising polishing particles, a protective film-forming agent, and water, wherein
   the protective film-forming agent is a copolymer of styrene and acrylonitrile,
   an average molecular weight of the copolymer of styrene and acrylonitrile is 500 or more and 20000 or less, and
   the copolymer of styrene and acrylonitrile is present in an amount of 0.1 part by mass or more and 5 parts by mass or less on the basis of 100 parts by mass of the polishing particles.

2. The CMP polishing agent according to claim 1, wherein the polishing particles are wet ceria particles.

3. The CMP polishing agent according to claim 2, wherein the pH is 3 or more and 7 or less.

4. The CMP polishing agent according to claim 3, wherein the CMP polishing agent is a CMP polishing agent for polishing an insulation film.

5. A method for polishing a substrate, comprising:
   moving the substrate and a turn table relatively to polish an insulation film on a polishing stop film formed on the substrate, with the insulation film being pressed against a polishing pad stuck on the turn table for polishing the substrate, while supplying the CMP polishing agent according to claim 4 onto the polishing pad.

6. The method for polishing a substrate according to claim 5, wherein the polishing stop film is a polysilicon film and the insulation film is a silicon oxide film.

7. A method for manufacturing the CMP polishing agent according to claim 4, comprising a step of:
   mixing: (i) the polishing particles, (ii) the water, and (iii) the copolymer of styrene and acrylonitrile having an average molecular weight of 500 or more and 20000 or less as the protective film-forming agent to manufacture the CMP polishing agent.

8. The CMP polishing agent according to claim 1, wherein the pH is 3 or more and 7 or less.

9. The CMP polishing agent according to claim 1, wherein the CMP polishing agent is a CMP polishing agent for polishing an insulation film.

10. A method for polishing a substrate, comprising:
moving the substrate and a turn table relatively to polish an insulation film on a polishing stop film formed on the substrate, with the insulation film being pressed against a polishing pad stuck on the turn table for polishing the substrate, while supplying the CMP polishing agent according to claim 1 onto the polishing pad.

11. The method for polishing a substrate according to claim 10, wherein the polishing stop film is a polysilicon film and the insulation film is a silicon oxide film.

12. A method for manufacturing the CMP polishing agent according to claim 1, comprising a step of:
mixing: (i) the polishing particles, (ii) the water, and (iii) the copolymer of styrene and acrylonitrile having an average molecular weight of 500 or more and 20000 or less as the protective film-forming agent to manufacture the CMP polishing agent.

\* \* \* \* \*